US009490017B2

(12) United States Patent
Chang et al.

(10) Patent No.: US 9,490,017 B2
(45) Date of Patent: Nov. 8, 2016

(54) FORCED-BIAS METHOD IN SUB-BLOCK ERASE

(71) Applicant: Macronix International Co., Ltd., Hsinchu (TW)

(72) Inventors: Kuo-Pin Chang, Yuanli Township, Miaoli County (TW); Hang-Ting Lue, Hsinchu (TW); Wen-Wei Yeh, Bade (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/643,907

(22) Filed: Mar. 10, 2015

(65) Prior Publication Data
US 2016/0267995 A1   Sep. 15, 2016

(51) Int. Cl.
| | | |
|---|---|---|
| G11C 11/34 | (2006.01) | |
| G11C 16/04 | (2006.01) | |
| G11C 16/14 | (2006.01) | |
| G11C 16/10 | (2006.01) | |

(52) U.S. Cl.
CPC ........... *G11C 16/14* (2013.01); *G11C 16/0466* (2013.01); *G11C 16/0475* (2013.01); *G11C 16/0483* (2013.01); *G11C 16/10* (2013.01)

(58) Field of Classification Search
CPC .............. G11C 16/14; G11C 16/0475; G11C 16/0466; G11C 16/0483; G11C 16/10
USPC ........................... 365/185.11, 185.15, 185.17
See application file for complete search history.

(56) References Cited

U.S. PATENT DOCUMENTS

| | | |
|---|---|---|
| 6,906,940 B1 | 6/2005 | Lue |
| 7,315,474 B2 | 1/2008 | Lue |
| 7,420,242 B2 | 9/2008 | Lung |
| 7,696,559 B2 | 4/2010 | Arai et al. |
| 7,851,849 B2 | 12/2010 | Kiyotoshi |
| 8,278,170 B2 | 10/2012 | Lee et al. |

(Continued)

FOREIGN PATENT DOCUMENTS

EP      2048709 A2    4/2009

OTHER PUBLICATIONS

Chen et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012, pp. 91-92.

(Continued)

*Primary Examiner* — Toan Le
(74) *Attorney, Agent, or Firm* — Yiding Wu; Haynes Beffel & Wolfeld LLP

(57) ABSTRACT

A method is provided for operating a NAND array that includes a plurality of blocks of memory cells. A block of memory cells includes a plurality of NAND strings having channel lines between first string select switches and second string select switches. The plurality of NAND strings shares a set of word lines between the first and second string select switches. A channel-side erase voltage is applied to the channel lines through the first string select switches in a selected block. Word line-side erase voltages are applied to a selected subset of the set of word lines in the selected block to induce tunneling in memory cells coupled to the selected subset. Word line-side inhibit voltages are applied to an unselected subset of the set of word lines in the selected block to inhibit tunneling in memory cells coupled to the unselected subset.

19 Claims, 9 Drawing Sheets

(56) References Cited

U.S. PATENT DOCUMENTS

| | | | |
|---|---|---|---|
| 8,363,476 | B2 | 1/2013 | Lue et al. |
| 8,467,219 | B2 | 6/2013 | Lue |
| 8,503,213 | B2 | 8/2013 | Chen et al. |
| 8,759,899 | B1 | 6/2014 | Lue et al. |
| 2005/0280061 | A1 | 12/2005 | Lee |
| 2007/0045708 | A1 | 3/2007 | Lung |
| 2007/0252201 | A1 | 11/2007 | Kito et al. |
| 2008/0073635 | A1 | 3/2008 | Kiyotoshi et al. |
| 2008/0175032 | A1 | 7/2008 | Tanaka et al. |
| 2008/0180994 | A1 | 7/2008 | Katsumata et al. |
| 2009/0097321 | A1 | 4/2009 | Kim et al. |
| 2009/0184360 | A1 | 7/2009 | Jin et al. |
| 2010/0270593 | A1 | 10/2010 | Lung et al. |
| 2011/0170353 | A1* | 7/2011 | Nguyen .................. G11C 8/08 365/185.18 |
| 2012/0119283 | A1 | 5/2012 | Lee et al. |
| 2012/0182806 | A1 | 7/2012 | Chen et al. |
| 2013/0279251 | A1* | 10/2013 | Lee ...................... G11C 16/26 365/185.03 |
| 2013/0343130 | A1* | 12/2013 | Chen .................... G11C 16/06 365/185.17 |
| 2014/0126291 | A1 | 5/2014 | Mihnea et al. |
| 2014/0198576 | A1* | 7/2014 | Hung .................... G11C 16/10 365/185.18 |
| 2014/0211563 | A1* | 7/2014 | Chang ................ G11C 16/3459 365/185.03 |
| 2016/0012905 | A1* | 1/2016 | Chang ................ G11C 11/5628 365/185.02 |
| 2016/0035422 | A1* | 2/2016 | Chang ............... H01L 27/11568 365/185.13 |

OTHER PUBLICATIONS

Choi et al., "Performance Breakthrough in NOR Flash Memory with Dopant-Segregated Schottky-Barrier (DSSB) SONOS Devices", 2009 Symposium on VLSI Technology Digest of Technical Papers, p. 222-223.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Nowak et al., "Intrinsic fluctuations in Vertical NAND flash memories," 2012 Symposium on VLSI Technology, Digest of Technical Papers, pp. 21-22, Jun. 12-14, 2012.

Tanaka H., et al., "Bit Cost Scalable Technology with Punch and Plug Process for Ultra High Density Flash Memory," 2007 Symp. VLSI Tech., Digest of Tech. Papers, pp. 14-15.

U.S. Appl. No. 14/284,306, filed May 21, 2014 by Hang-Ting Lue, 60 pages.

U.S. Appl. No. 14/582,963, filed Dec. 24, 2014 by Shih-Hung Chen, 35 pages.

Wang, Michael, "Technology Trends on 3D-NAND Flash Storage", Impact 2011, Taipei, dated Oct. 20, 2011, found at www.impact.org.tw/2011/Files/NewsFile/201111110190.pdf.

* cited by examiner

FORCED-BIAS METHOD IN SUB-BLOCK ERASE

BACKGROUND

1. Field of the Technology

The present technology relates to high density memory devices, and particularly the operation of devices using stacked memory structures.

2. Description of Related Art

As critical dimensions of devices in integrated circuits shrink toward perceived limits of manufacturing technologies, designers have been looking to techniques to achieve greater storage capacity, and to achieve lower costs per bit. Technologies being pursued include multiple layers of memory cells on a single chip. Operations performed on a 3D (three-dimensional) NAND memory having multiple layers of memory cells include read, write and erase.

Typically, erase operations are performed by blocks of memory cells, where the general issue of high density NAND, and in particular high density 3D NAND, memories is that the size of a block of memory cells is often very large. This is not convenient if a user only needs to change the code of a small unit stored in a 3D NAND memory. As the density of 3D NAND memories increases, the number of layers in the stacks increase, leading to larger block sizes and further inconvenience in erase operations.

Thus, it is desirable to provide for a technology with more efficient and convenient erase operations in 3D NAND memories.

SUMMARY

A method is provided for sub-block erase in an NAND array, where a sub-block can include a half of the memory cells in a block, or another portion of the block as explained below. The term "block" as used herein is a set of NAND strings operated simultaneously during an erase operation, and in which all the NAND strings are connected to a reference voltage during the erase operation, usually via a line called a common source line in response to a shared control signal usually called a ground select signal on a ground select line GSL, even though the reference line may be coupled to potentials other than ground. Also, all the NAND strings in a block are connected to a shared set of word lines. The bit lines in a block can be connected to the NAND strings individually in response to a control signal usually called a string select signal on a set of string select lines SSLs. In a block erase operation, all the string select signals for a selected block are operated simultaneously to cause erase of the complete block. Also, blocks are often configured on an integrated circuit so that they can be electrically isolated from adjacent blocks for the purposes of a block erase operation, such as by being separated from one another by insulating structures.

A method is described for operating a NAND array that includes a plurality of blocks of memory cells, which includes a sub-block erase operation. The method is applicable to both single layer NAND arrays and multilayer or 3D NAND arrays.

In operating methods described herein, a sub-block can be erased that includes the memory cells that share a subset of the set of word lines of the block, where the subset includes more than one member. In this manner, some of the memory cells in all of the NAND strings in the block are erased. The erase operation can be configured therefore to erase a unit smaller than a block of the memory array, increasing operational flexibility.

A block can be logically or physically divided into two or more sub-blocks for the purposes of a sub-block erase operation, using biasing arrangements of the word lines, while the ground select signal and all the string select signals for the block are set to select the block. The word lines can be biased in the selected block to cause erase of a sub-block and to inhibit erase of the remainder of the block. One or more word lines can be operated in a boundary mode which is different from an inhibit mode applied to other word lines, which serves to support the erase of the sub-block.

In one operating method described herein, a channel-side erase voltage is applied to the channel lines of the NAND strings in a selected block through the first string select switches. Word line-side erase voltages are applied to a selected subset of the set of word lines in the selected block to induce tunneling in memory cells coupled to the selected subset. The selected subset can include more than one member of the set of word lines. Word line-side inhibit voltages are applied to an unselected subset of the set of word lines in the selected block to inhibit tunneling in memory cells coupled to the unselected subset. The unselected subset can include more than one member of the set of word lines.

A first bias voltage can be applied on a first boundary word line in the set of word lines, to induce first boundary conditions, between the selected subset of the set of word lines and the unselected subset of the set of word lines. A second bias voltage can be applied on a second boundary word line in the set of word lines, to induce second boundary conditions, between the first boundary word line and the unselected subset of the set of word lines. In one implementation, the first bias voltage can be between the word line-side erase voltages and the second bias voltage, and the word line-side inhibit voltages is higher than the second bias voltage.

The first boundary conditions can include electric fields for suppression of hot carrier injection in memory cells coupled to the selected subset. The second boundary conditions can include electric fields for suppression of hot carrier injection in memory cells coupled to the unselected subset. The hot carrier injection is inducible by difference between a first channel potential in the channel lines in memory cells coupled to the selected subset and a second channel potential in the channel lines in memory cells coupled to the unselected subset.

An erase operation can be executed that causes memory cells coupled to the selected subset to have a first threshold voltage distribution that is non-overlapping with a second threshold voltage distribution of memory cells at programmed states coupled to the unselected subset, where the erase operation includes one or more erase and verify cycles including applying the first bias voltage and applying the second bias voltage, during applying the word line-side erase voltages and applying the word line-side inhibit voltages, as described herein.

Data stored in memory cells coupled to the first boundary word line and the second boundary word line in the selected block can be moved to another block in the plurality of blocks of memory cells, before the word line-side erase voltages are applied to the selected subset of the set of word lines in the selected block. The data stored in the other block can be moved back to the memory cells coupled to the first boundary word line and the second boundary word line in the selected block respectively, after the word line-side erase voltages are applied.

The first bias voltage can be applied on a third boundary word line in the set of word lines, to induce the first boundary conditions, where the third boundary word line is adjacent the selected subset on a side of the selected subset opposite the first boundary word line. The second bias voltage can be applied on a fourth boundary word line in the set of word lines, to induce the second boundary conditions, where the fourth boundary word line is adjacent the third boundary word line on a side of the third boundary word line opposite the selected subset of the set of word lines.

A number of word lines can be logically selected for the selected subset of the set of word lines.

In response to a command to erase memory cells coupled to the selected subset of the set of word lines in the selected block, a channel-side erase voltage can be applied to the channel lines in a selected block, word line-side erase voltages can be applied to a selected subset of the set of word lines in the selected block, and word line-side inhibit voltages can be applied to an unselected subset of the set of word lines in the selected block.

Other aspects and advantages of the present technology can be seen on review of the drawings, the detailed description and the claims, which follow.

DETAILED DESCRIPTION

Figure 1:
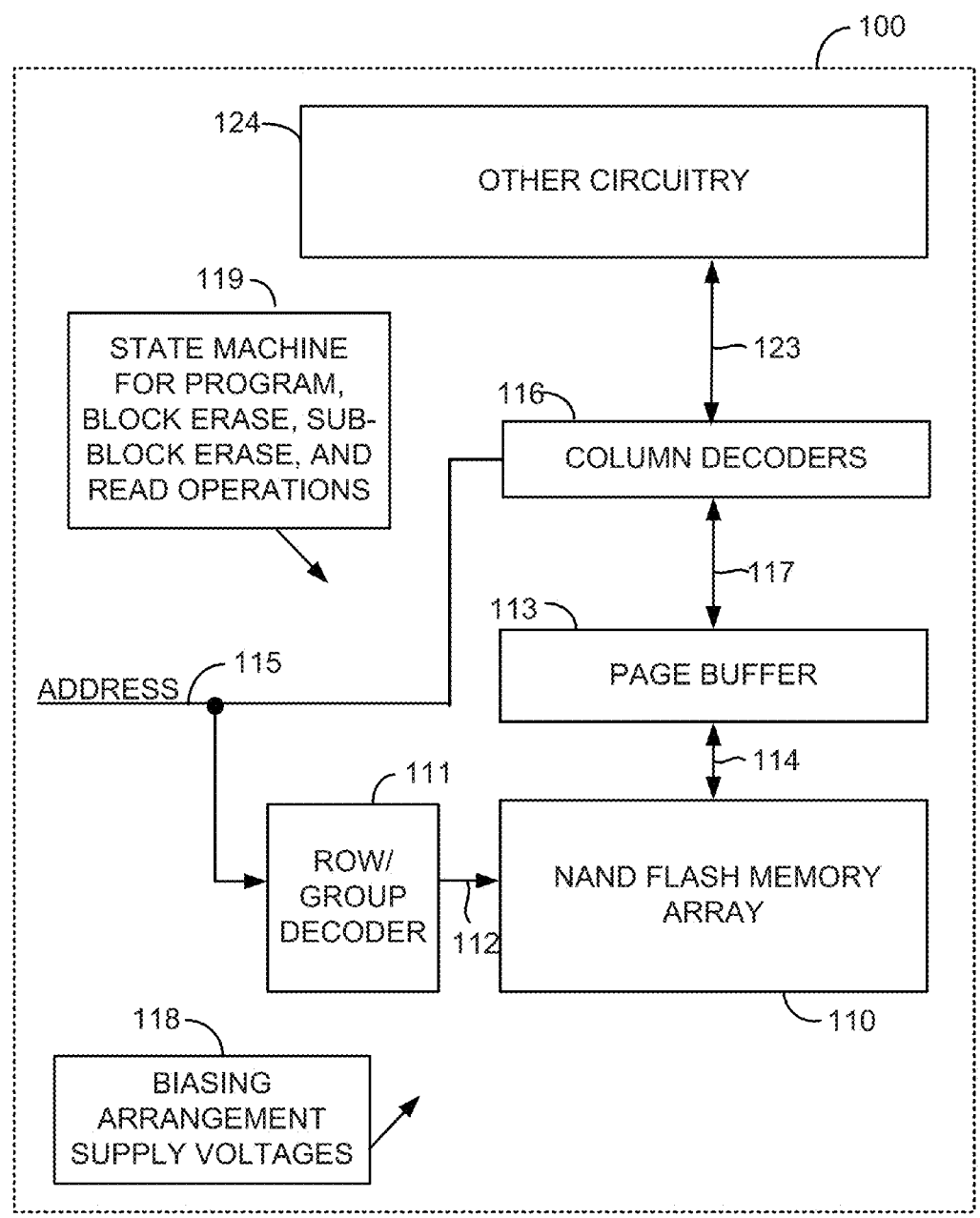
FIG. 1 is a simplified block diagram of an integrated circuit memory employing memory cells and bias circuitry according to embodiments of the present technology.

A detailed description of embodiments of the present technology is provided with reference to the Figures. It is to be understood that there is no intention to limit the technology to the specifically disclosed structural embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

FIG. 1 is a simplified block diagram of an integrated circuit 100 including a NAND flash memory array 110 which can be operated as described herein. In some embodiments, the array 110 is a 3D memory and includes multiple layers of cells. The array can include a plurality of blocks of memory cells, where a block of memory cells can include a plurality of NAND strings having channel lines between first string select switches and second string select switches. The plurality of NAND strings shares a set of word lines between the first and second string select switches.

A row decoder 111 is coupled to a plurality of word lines 112 arranged along rows in the memory array 110. The row decoder can include a set of local word line drivers that drive respective word lines in the set of word lines in a selected block of memory cells. The set of local word line drivers can include a first subset of the set of local word line drivers driving a first subset of the set of word lines, a second subset of the set of local word line drivers driving a second subset of the set of word lines, a first boundary word line driver driving a first boundary word line in the set of word lines between the first subset of the set of word lines and the second subset of the set of word lines, and a second boundary word line driver driving a second boundary word line in the set of word lines between the first boundary word line and the second subset of the set of word lines.

The memory includes a set of global word lines, including first global word lines connected to the first subset of the set of local word line drivers, second global word lines connected to the second subset of the set of local word line drivers, a third global word line connected to the first boundary word line driver, and a fourth global word line connected to the second boundary word line driver.

Column decoders in block 116 are coupled to a set of page buffers 113, in this example via data bus 117. The global bit lines 114 are coupled to the set of page buffers 113 and to channel lines (not shown) arranged along columns in the memory array 110. Addresses are supplied on bus 115 to column decoder (block 116) and row decoder (block 111). Data is supplied via the data-in line 123 from other circuitry 124, including for example input/output ports, on the integrated circuit, such as a general purpose processor or special purpose application circuitry, or a combination of modules providing system-on-a-chip functionality supported by the array 110. Data is supplied via the data-in line 123 to input/output ports or to other data destinations internal or external to the integrated circuit 100.

A controller, implemented in this example as a state machine (e.g. 119), is coupled to the blocks of memory cells, and provides signals to control the application of bias arrangement supply voltages generated or provided through the voltage supply or supplies in block 118 to carry out the various operations described herein on data in the array. These operations include program, block erase, sub-block erase, and read. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

The controller can include logic to execute sub-block erase operations described herein. For instance, the controller can include logic to bias a sub-block of memory cells for negative Fowler-Nordheim (-FN) tunneling to inject holes into the charge storage structures of cells in the selected sub-block, thereby reducing the threshold voltages, at least in cells of the sub-block that do not already have a low threshold voltage.

In one implementation, the controller can include logic to apply a channel-side erase voltage to the channel lines through the first string select switches in the selected block, logic to apply word line-side erase voltages to a first subset of the set of word lines in the selected block to induce tunneling in memory cells coupled to the first subset, and logic to apply word line-side inhibit voltages to a second subset of the set of word lines in the selected block to inhibit tunneling in memory cells coupled to the second subset. The first subset of the set of word lines can include more than one member of the set of word lines, and the second subset of the set of word lines can include more than one member of the set of word lines.

The controller can include logic to apply a first bias voltage on the first boundary word line in the set of word lines, to induce first boundary conditions, between the first subset of the set of word lines and the second boundary word line. The first boundary conditions can include electric fields for suppression of hot carrier injection in memory cells coupled to the first subset of the set of word lines. The hot carrier injection is inducible by difference between a first channel potential in the channel lines in memory cells coupled to the first subset of the set of word lines and a second channel potential in the channel lines in memory cells coupled to the second subset of the set of word lines.

The controller can include logic to apply a second bias voltage on the second boundary word line in the set of word lines, to induce second boundary conditions, between the first boundary word line and the second subset of the set of word lines. The second boundary conditions can include electric fields for suppression of hot carrier injection in memory cells coupled to the second subset of the set of word lines. The hot carrier injection is inducible by difference between a first channel potential in the channel lines in memory cells coupled to the first subset of the set of word lines and a second channel potential in the channel lines in memory cells coupled to the second subset of the set of word lines.

The controller can include logic to select a number of word lines for the selected subset of the set of word lines. The controller can include logic to move data stored in memory cells coupled to the first boundary word line and the second boundary word line in the selected block to another block in the plurality of blocks of memory cells, before the word line-side erase voltages are applied to the selected subset of the set of word lines in the selected block. The controller can include logic to move data stored in the other block back to the memory cells coupled to the first boundary word line and the second boundary word line in the selected block respectively, after the word line-side erase voltages are applied.

The controller can be configured to execute the logic to apply the channel-side erase voltage to the channel lines in a selected block, the logic to apply the word line-side erase voltages to a first subset of the set of word lines in the selected block, and the logic to apply the word line-side inhibit voltages to a second subset of the set of word lines in the selected block, in response to a sub-block erase command to erase memory cells coupled to the first subset of the set of word lines in the selected block. The sub-block erase command can be issued from a source external or internal to the memory. A number of word lines for the first subset of the set of word lines can be logically selected. For instance, the sub-block erase command can include a parameter indicating the size of a sub-block to be erased, where the size can be the number of word lines (e.g. 11), or a range of word lines (e.g. WL10-WL20), for the first subset of the set of word lines.

For clarity purposes, the term "program" as used herein refers to an operation which increases the threshold voltage of a memory cell. The data stored in a programmed memory cell can be represented as a logical "0" or logical "1." The term "erase" as used herein refers to an operation which decreases the threshold voltage of a memory cell. The data stored in an erased memory cell can be represented as the inverse of the programmed state, as a logical "1" or a logical "0." Also, multibit cells can be programmed to a variety of threshold levels, and erased to a single lowest threshold level. Further, the term "write" as used herein describes an operation which changes the threshold voltage of a memory cell, and is intended to encompass both program and erase, or a combination of program and erase operations.

Figure 2:
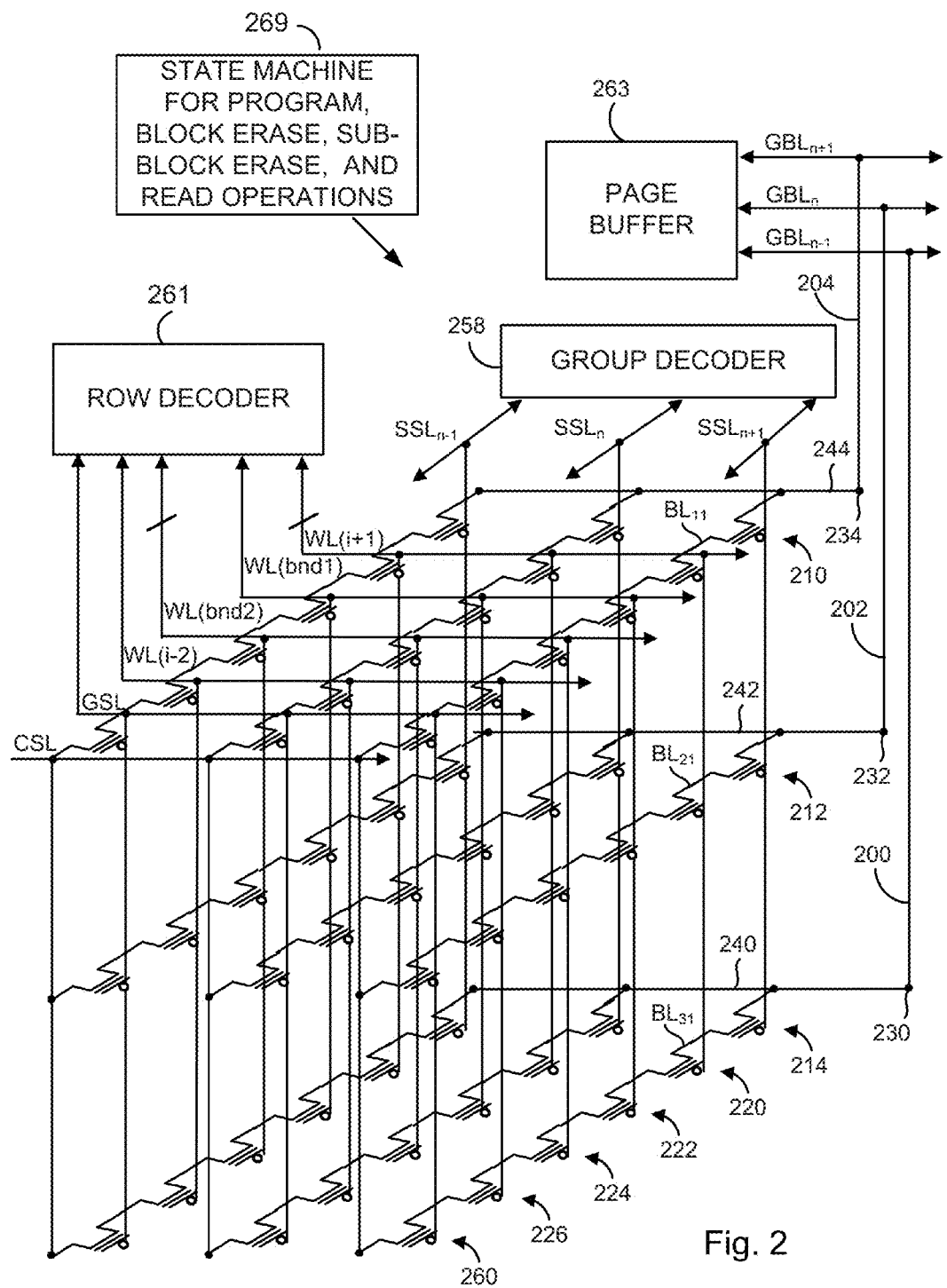
FIG. 2 is a schematic diagram of a portion of the 3D NAND flash memory array usable in a device like that of FIG. 1.

FIG. 2 is a schematic diagram of a portion of the 3D NAND flash memory array usable in a device like that of FIG. 1. In this example, three layers of memory cells are illustrated, which is representative of a block of p-channel memory cells that can include many layers.

In one implementation, a set of word lines in a block of memory cells can have 64 word lines. In another implementation, a set of word lines in a block of memory cells can have more or fewer number of word lines, such as 32 or 128 word lines. As shown in the example of FIG. 2, a set of word lines includes word lines WL0 to WL(i−2), WL(bnd2), WL(bnd1), WL(i+1) to WL63 extend in parallel along a first direction. The word lines WL(i−2), WL(bnd2), WL(bnd1), and WL(i+1) are shown in FIG. 2. A first boundary word line WL(bnd1) can correspond to WL(i), and a second boundary word line WL(bnd2) can correspond to WL(i−1). The set of word lines includes a first subset including word lines WL(i+1) to WL63, and a second subset including word lines WL0 to WL(i−2). The index i can be such that the first subset of the set of word lines includes more than one member of the set of word lines, and the second subset of the set of word lines includes more than one member of the set of word lines.

The set of word lines includes the first boundary word line (e.g. WL(bnd1)) between the first subset of the set of word lines and the second subset of the set of word lines, and the second boundary word line (e.g. WL(bnd2)) between the first boundary word line and the second subset of the set of word lines. Sub-block erase operations including using the first and second boundary word lines are described in connection with FIGS. 5-6.

Figure 5:
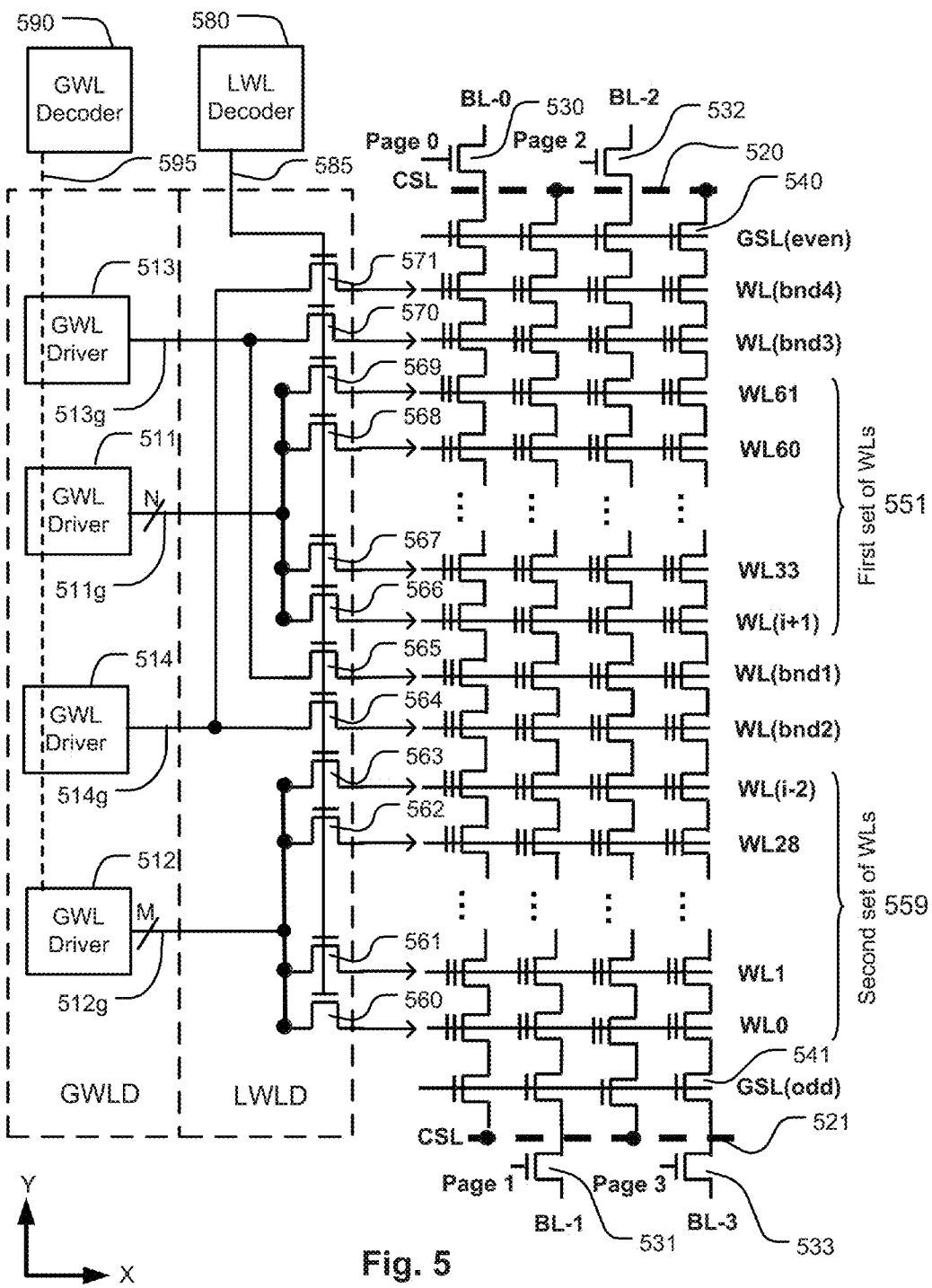
FIG. 5 is a circuit diagram showing example NAND strings in an X-Y plane in a block of memory cells connected to a configuration of local and global word line drivers in a 3D memory.

The word lines are in electrical communication with row decoder 261, which can include the global word line decoder 590 and local word line decoder 580 as shown in FIG. 5. The word lines are connected to the gates of the memory cells, which are arranged in series as a plurality of NAND strings. As shown in FIG. 2, each word line is vertically connected to the gates of the memory cells in each of the various layers underlying the word line.

The plurality of NAND strings has channel lines in the various layers of the memory array. As shown in FIG. 2, the array includes a channel line $BL_{31}$ on the third level, a channel line $BL_{21}$ on the second level, and a channel line $BL_{11}$ on the first level. The memory cells have dielectric charge trapping structures between the corresponding word lines and the corresponding channel lines. In this illustration, there are four memory cells in a NAND string for simplicity. For example, a NAND string formed by channel line $BL_{31}$ on the third level includes memory cells 220, 222, 224 and 226. In a typical implementation, a NAND string can include 16, 32, 64 or more memory cells, connected to 16, 32, 64 or more word lines respectively.

A plurality of string select lines including string select lines $SSL_{n-1}$, $SSL_n$, $SSL_{n+1}$ are in electrical communication with group decoder 258 (which could be part of the row decoder 261), which selects a group of strings. The string select lines are connected to the gates of first string select switches arranged at the first ends of the memory cell NAND strings. As shown in FIG. 2, each of the string select lines are vertically connected to the gates of a column of the string select switches in each of the various layers. For example, string select line $SSL_{n+1}$ is connected to the gates of string select switches SSL 210, 212, 214 in the three layers.

The channel lines on a particular level are selectively coupled to an extension on the particular level by the corresponding string select switches. For example, the channel lines on the third level are selectively coupled to extension 240 by the corresponding string select switches in that level. Similarly, the channel lines on the second level are selectively coupled to extension 242, and channel lines on the first level are selectively coupled to extension 244.

The extensions on each of the layers include a corresponding contact pad for contact with a vertical connector coupled to a corresponding global bit line. For example, extension 240 in the third level is coupled to a global bit line $GBL_{n-1}$ via contact pad 230 and vertical connector 200. Extension 242 on the second level is coupled to a global bit line $GBL_n$ via contact pad 232 and vertical connector 202. Extension 244 on the third level is coupled to a global bit line $GBL_{n+1}$ via contact pad 234 and vertical connector 204. The contact pads can be implemented using a stairstep pad as described herein (e.g. 302B, FIG. 3).

The global bit lines $GBL_{n-1}$, $GBL_n$, and $GBL_{n+1}$ are coupled to additional blocks (not shown) in the array and extend to page buffer 263.

Ground select switches (sometimes referred to as second string select switches) are arranged at the second ends of the NAND strings. For example, ground select switch 260 is arranged at the second end of the NAND string formed by memory cells 220, 222, 224 and 226. A ground select line GSL is connected to the gates of the ground select switches. The ground select line GSL is in electrical communication with the row decoder 261 to receive bias voltages during operations described herein.

The ground select switches are used to selectively couple second ends of all the NAND strings in the block to a common source line CSL. The common source line CSL receives bias voltages from the bias circuit (e.g. 118, FIG. 1) during operations described herein.

The blocks can be arranged in an array of blocks, including rows of blocks and columns of blocks. Blocks in a row can share the same sets of word lines and ground select lines GSL. Blocks in a column can share the same sets of global bit lines $GBL_{n-1}$, $GBL_n$, and $GBL_{n+1}$. In this manner, a 3D decoding network is established, selected memory cells which are part of a page can be accessed using one word line, and a set of global bit lines $GBL_{n-1}$, $GBL_n$, and $GBL_{n+1}$ and one string select line deliver data from cells selected in each level in parallel on the set of global bit lines $GBL_{n-1}$, $GBL_n$, and $GBL_{n+1}$.

The array shown in FIG. 2 includes p-channel NAND strings implemented in a horizontal configuration, with all the cells in a given string on the same level of the array. In alternative 3D arrangements, the NAND strings can be implemented in a vertical configuration. In some embodiments, the NAND strings are junction-free, in which there are no p-type terminals between the cells. P-type terminals can be implemented only on the sides of the SSL transistors (e.g. 210) that are connected to the bit line extensions (e.g. line 244), and on the sides of the GSL switches (e.g. 260) that are connected to the common source line CSL. A state machine 269 is shown that is configured to control the memory array and supporting circuitry to perform program, block erase, sub-block erase and read operations.

Figure 3:
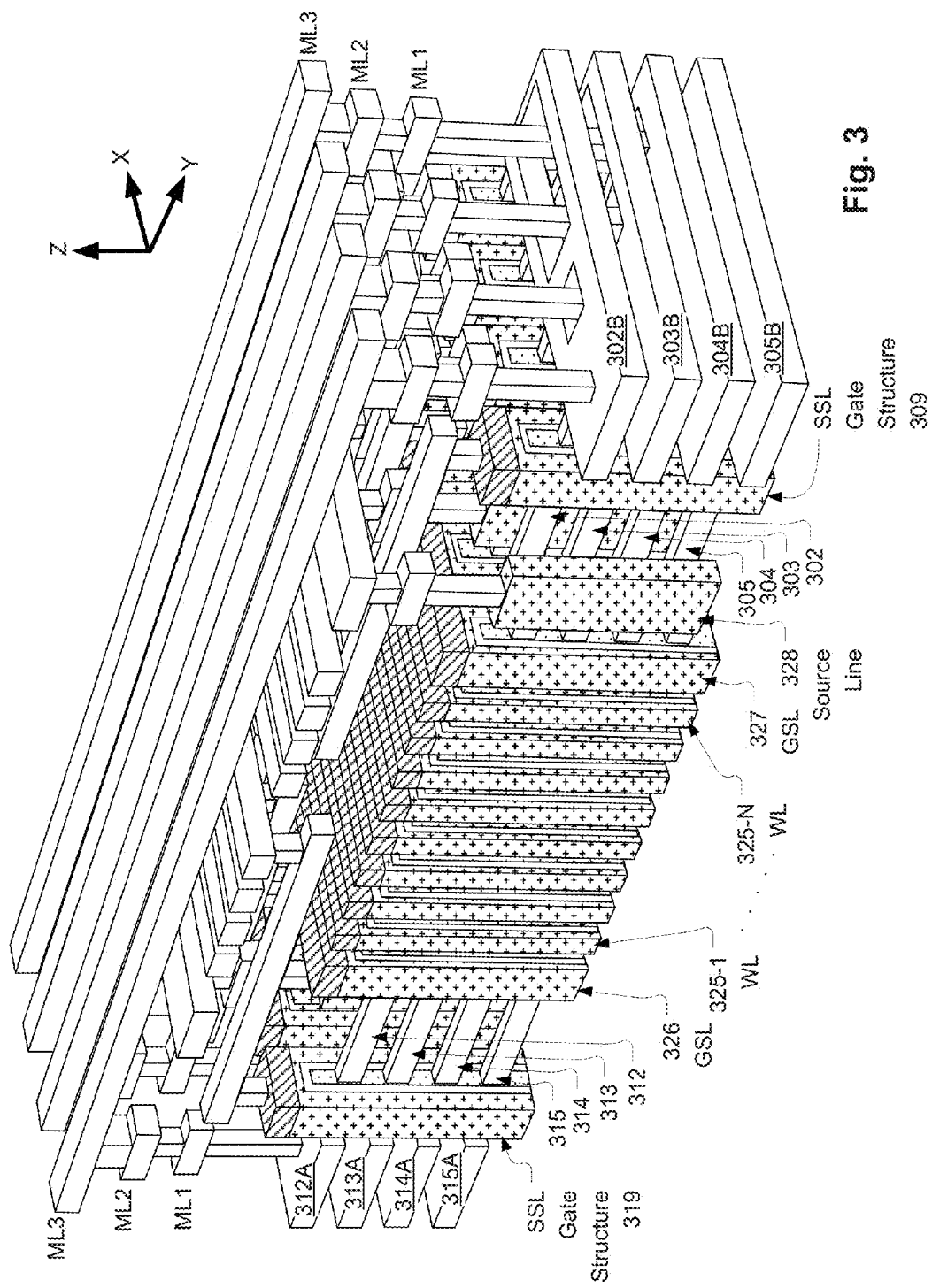
FIG. 3 is a perspective illustration of a 3D unit including even and odd blocks of memory cells including stacks of layers of NAND strings in a 3D vertical gate (3DVG) NAND-flash memory array structure.

FIG. 3 is a perspective illustration of a 3D unit including even and odd blocks (as defined above) of memory cells including stacks of layers of NAND strings in a 3D vertical gate (3DVG) NAND-flash memory array structure. The 3D NAND-flash memory array structure is described in commonly owned U.S. Pat. No. 8,503,213 issued 6 Aug. 2013, which is hereby incorporated by reference as if fully set forth herein. Insulating material is removed from the drawing to expose additional structure. For example, insulating layers are removed between the NAND strings in the stacks, and are removed between the stacks of NAND strings.

Alternative 3D NAND structures can be referred to as vertical channel NAND arrays, such as those described in our co-pending application Ser. No. 14/284,306 filed 21 May 2014, and application Ser. No. 14/582,963 filed 24 Dec. 2014, which are incorporated by reference as if fully set forth herein. Vertical channel NAND arrays also include blocks as described herein, and can be configured and operated for sub-block erase using the biasing techniques described herein.

The 3D NAND-flash memory array structure in both the vertical channel and vertical gate structures includes stacked memory structures resulting in the array having a plurality of blocks of memory cells disposed in a dense configuration.

In the example shown in FIG. 3, the block of the multi-layer array is formed on an insulating layer, and includes a plurality of word lines 325-1, . . . , 325-N. The stacks include channel lines (e.g. 312, 313, 314, 315 in the first even page stack). The stack of channel lines 312, 313, 314, 315 is terminated at one end by the stairstep pads 312A, 313A, 314A, 315A, and passes through SSL switches 319, ground select line GSL 326, word lines 325-1 WL through 325-N WL, ground select line GSL 327, and terminates at the other end by source line 328. The stack of channel lines 312, 313, 314, 315 does not reach the stairstep pads 302B, 303B, 304B, 305B. Thus, the even block shares the even ground select line GSL and all the word lines, and the odd block shares the odd ground select line GSL and all the word lines. The even and odd blocks are interleaved in this example, allowing a unit that is N strings wide to operate with N/2 bit lines. Because of the proximity of the interleaved strings of memory cells in the even and odd blocks, the even and odd page blocks in this configuration can be operated together for an erase operation. Other embodiments do not use interleaved even and odd stacks.

The stack of channel lines 302, 303, 304, 305 in the first odd page stack, is terminated at one end by the stairstep pads 302B, 303B, 304B, 305B, and passes through SSL switches 309, ground select line GSL 327, word lines 325-N WL through 325-1 WL, ground select line GSL 326, and terminates at the other end by a source line (obscured by other parts of the figure). The stack of channel lines 302, 303, 304, 305 does not reach the stairstep pads 312A, 313A, 314A, 315A.

The shown word line numbering, ascending from 1 to N going from the back to the front of the overall structure, applies for a sequence going from SLL to GSL on even memory pages. For odd memory pages, the word line numbering descends from N to 1 going from the front to the back of the overall structure, applies for a sequence going from SSL to GLS on odd memory pages.

Stairstep pads 312A, 313A, 314A, 315A terminate channel lines in even pages, such as channel lines 312, 313, 314, 315. As illustrated, these stairstep pads 312A, 313A, 314A, 315A are electrically connected to different bit lines for connection to decoding circuitry to select layers of memory cells within the array. These stairstep pads 312A, 313A, 314A, 315A can be patterned at the same time that the plurality of stacks are defined.

Stairstep pads 302B, 303B, 304B, 305B terminate channel lines in odd pages, such as channel lines 302, 303, 304, 305. As illustrated, these stairstep pads 302B, 303B, 304B, 305B are electrically connected to different bit lines for connection to decoding circuitry to select layers of memory cells within the array. These stairstep pads 302B, 303B, 304B, 305B can be patterned at the same time that the plurality of stacks are defined.

Any given stack of channel lines is coupled to either the stairstep pads 312A, 313A, 314A, 315A on one end of the block, or the stairstep pads 302B, 303B, 304B, 305B on the other end of the block, but not both. Other blocks in an array of blocks can be electrically isolated from one another by the use of separate stacks of channel lines and stairstep pads that connect the channel lines in a block together, with insulating material disposed between them the separated stacks. In this way, the separate blocks can be operated independently for erase, if their control signals are separately decoded.

Ground select lines GSL 326 and GSL 327 are conformal with the plurality of stacks, similar to the word lines.

Every stack of channel lines is terminated at one end by a set of stairstep pads, and at the other end by a source line. For example, the stack of channel lines 312, 313, 314, 315 is terminated at one end by stairstep pads 312A, 313A, 314A, 315A, and terminated on the other end by source line 328. At the near end of the figure, every other stack of channel lines is terminated by the stairstep pads 302B, 303B, 304B, 305B, and every other stack of channel lines is terminated by a separate source line. At the far end of the figure, every other stack of channel lines is terminated by the stairstep pads 312A, 313A, 314A, 315A, and every other stack of channel lines is terminated by a separate source line.

Bit lines and string select lines are formed at the metals layers ML1, ML2, and ML3.

Memory cells are formed with memory material between the channel lines and the word lines 325-1 through 325-N. In the memory cells, the channel line (e.g. 313) acts as the channel region of the device. SSL switches (e.g. 319, 309) can be patterned during the same step that the word lines 325-1 through 325-N are defined. The memory material can act as the gate dielectric for the SSL switches. The SSL switches can be coupled to decoding circuitry for selecting particular stacks in the array.

A general issue of 3D NAND memories is that the size of a block of memory cells is often very large. As the density of 3D NAND memories increases, the number of pages and the number of layers increase, leading to larger block sizes and slower timing specification for block erase operations. The slower timing specification for block erase operations degrades the performance of a 3D NAND memory when a user only needs to change the code of a small unit stored in a sub-block of memory cells in the 3D NAND memory.

In the present technology, a set of word lines shared by a plurality of NAND strings can be divided into a first subset and a second subset of the set of word lines, allowing memory cells coupled to one of the first subset and the second subset to be erased, while inhibiting tunneling in memory cells coupled to the other one of the first subset and the second subset. Consequently, only some but not all memory cells in a block are erased in a sub-block erase operation, thus enabling faster timing specification for sub-block erase operations than for block erase operations and enhancing the performance of a 3D NAND memory.

A sub-block erase command can be issued from a source external or internal to the memory. A number of word lines for the first subset of the set of word lines can be logically selected. For instance, the sub-block erase command can include a parameter indicating the size of a sub-block to be erased, where the size can be the number of word lines (e.g. 11), or a range of word lines (e.g. WL10-WL20), for the first subset of the set of word lines.

Figure 4:
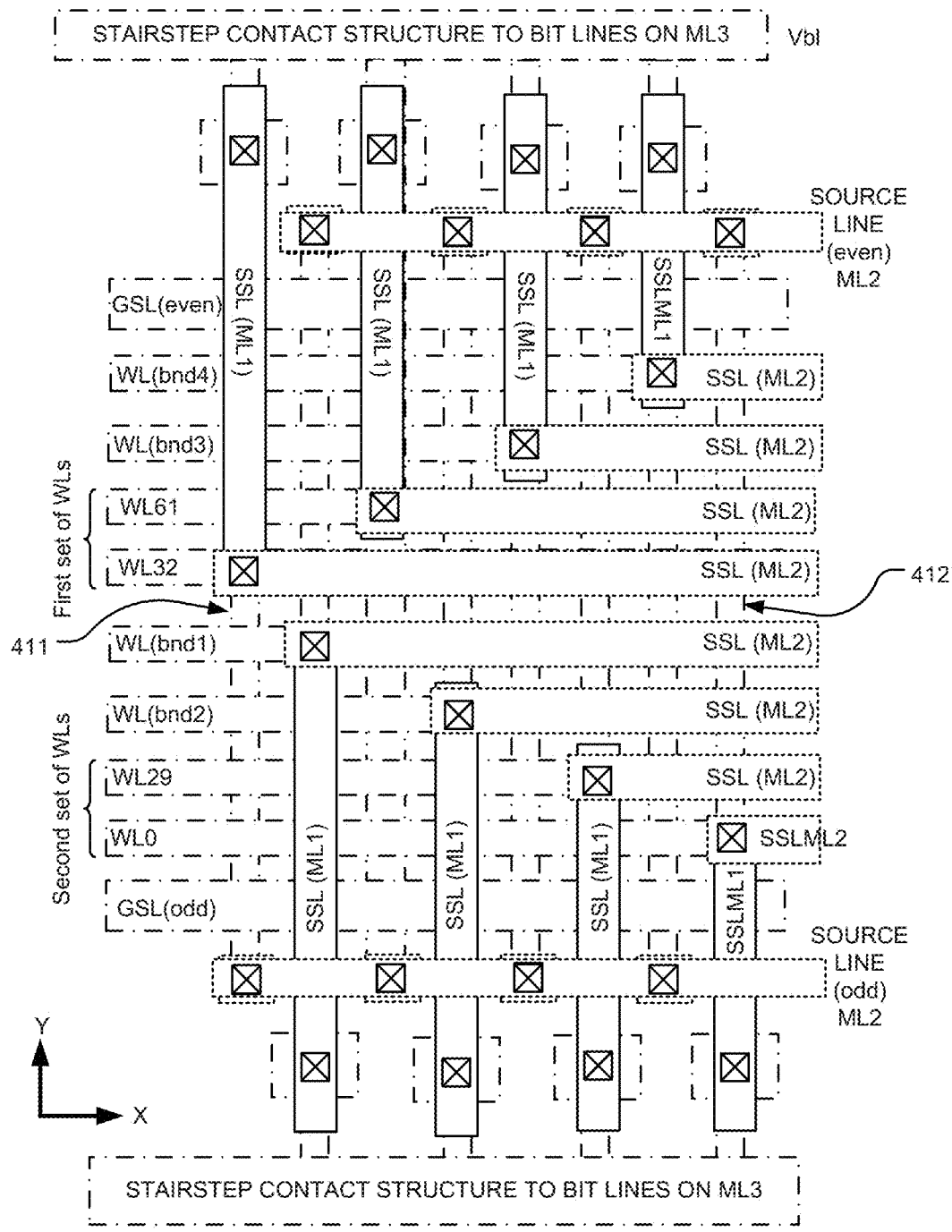
FIG. 4 is an example layout view of the 3D NAND-flash memory array structure of FIG. 3.

FIG. 4 is an example layout view of the 3D NAND-flash memory array structure of FIG. 3. The 3D NAND-flash memory array structure includes a plurality of blocks of memory cells. A block of memory cells includes a plurality of NAND strings having channel lines between first string select switches (e.g. SSL) and second string select switches (e.g. GSL), and in which the plurality of NAND strings shares a set of word lines (e.g. WL0-WL63) between the first and second string select switches.

In the layout view of FIG. 4, stacks of channel lines are shown as vertical strips with dot-dash borders. Adjacent stacks of channel lines alternate between the even and odd orientations. Every odd stack of channel lines (e.g. 411) runs from the bit line contact pad structure at the top to the odd source line at the bottom. Every even stack of channel lines (e.g. 412) runs from the bit line contact pad structure at the bottom to the even source line structure at the top.

Overlying the stacks of channel lines, are the horizontal word lines and the horizontal ground select lines GSL (even) and GSL (odd). Also overlying the stacks of channel lines, are the SSL switches. The odd SSL switches overlie every other stack of channel lines at the top end of the channel lines, and the even SSL switches overlie every other stack of channel lines at the bottom end of the channel lines. In either case, the SSL switches control electrical connection between any stack of channel lines and the stack's corresponding bit line contact stairstep pads.

As shown in the example of FIG. 4, a set of word lines including word lines WL0 to WL29, WL(bnd2), WL(bnd1), WL(32) to WL61, WL(bnd3), and WL(bnd4), extend in parallel along a first direction. The word lines WL0, WL29, WL(bnd2), WL(bnd1), WL(32), WL61, WL(bnd3), and WL(bnd4) are shown in FIG. 2. The set of word lines includes a first subset including word lines WL32 to WL61, and a second subset including word lines WL0 to WL29. The word lines are in electrical communication with row decoder 161 (FIG. 2). The word lines are connected to the gates of the memory cells, which are arranged in series as NAND strings.

The set of word lines includes the first boundary word line (e.g. WL(bnd1)) between the first subset of the set of word lines and the second subset of the set of word lines, and the second boundary word line (e.g. WL(bnd2)) between the first boundary word line and the second subset of the set of word lines. Sub-block erase operations including using the first and second boundary word lines are described in connection with FIGS. 5-6.

Overlying the word lines, ground select lines, and SSL switches, are the ML1 SSL string select lines running vertically. Overlying the ML1 SSL string select lines are the ML2 SSL string select lines running horizontally. Although the ML2 SSL string select lines are shown as terminating at corresponding ML1 SSL string select lines for ease of viewing the structure, the ML2 SSL string select lines may run longer horizontally. The ML2 SSL string select lines carry signals from the decoder, and the ML1 SSL string select lines couple these decoder signals to particular SSL switches to select particular stacks of channel lines.

Also overlying the ML1 SSL string select lines are the source lines, even and odd. Further, overlying the ML2 SSL string select lines are the ML3 bit lines (not shown) which connect to the stairstep contact structures at the top and the bottom. Through the stairstep contact structures, the bit lines select particular layers of channel lines.

Particular bit lines can be electrically connected to different layers of channel lines. The SSLs of the particular bit lines can be biased to connect the particular bit lines to different layers of channel lines.

Under a sub-block erase bias arrangement, a channel-side erase voltage (e.g. Vb1) can be applied to the channel lines through the first string select switches (e.g. SSL switches) in a selected block, where the plurality of bit lines is connected to the channel lines (e.g. 411, 412) of a plurality of NAND strings in the block of memory cells. Word line-side erase voltages can be applied to the first subset of the set of word lines (e.g. WL32-WL61) in the selected block to induce tunneling in memory cells coupled to the first subset. Word line-side inhibit voltages can be applied to the second subset of the set of word lines (e.g. WL0-WL29) in the selected block to inhibit tunneling in memory cells coupled to the second subset of the set of word lines.

A first bias voltage can be applied on the first boundary word line (e.g. WL(bnd1)) in the set of word lines, to induce first boundary conditions, between the first subset of the set of word lines and the second subset of the set of word lines. A second bias voltage can be applied on the second boundary word line (e.g. WL(bnd2)) in the set of word lines, to induce second boundary conditions, between the first boundary word line and the second subset of the set of word lines.

In the vertical gate 3D structure of FIG. 3, the block of memory cells includes a plurality of pages of memory cells, where a page can be defined, for the purpose of this description, in this structure as including the memory cells in one stack of channel lines, selected by a single SSL switch, where each channel line is coupled to a corresponding bit line via the stairstep pads. An array page can be defined as a plurality of pages from different blocks operated in parallel. The definition of a page and the decoding applied to access a page can vary as suits a particular memory architecture. The memory structure can include a page program buffer to which the set of N bit lines is coupled in parallel, for use in the program and program verify steps described herein. In the illustrated example, there are four layers of memory cells, which provides for four bit lines per page. In other examples there are other numbers of layers. In one example considered herein, there can be eight layers, with eight even stacks and eight odd stacks, making a memory block including a total of 16 pages of eight bits each.

The memory unit can be repeated left and right, to establish wider array pages, that include with four bits from each page in a row of blocks being selected by each word line that traverses the row of blocks. For a representative configuration storing N*8 megabytes of data in a row of blocks, an integrated circuit may include 8000 global bit lines, overlying rows of 1000 side-by-side blocks of cells each of which have sixteen pages of 512 N-bit cells coupled to eight global bit lines in the even/odd arrangement. Each row of blocks may have 64 word lines, and have a depth of eight layers making 256 cells in each of the even and odd blocks. Thus, a single eight layer strip selected by an SSL signal in a single block, will include 512 cells (64*8), each storing multiple bits of data. A block of sixteen such strips will have 8K cells.

FIG. 5 is a circuit diagram showing example NAND strings in an X-Y plane in a block of memory cells connected to a configuration of local and global word line drivers in a 3D memory. The NAND strings correspond to four pages of memory cells: Page 0, Page 1, Page 2 and Page 3. The NAND strings can be disposed on the same level of the 3D array like that of FIG. 2, sharing even and odd GSL lines for the even and odd pages, and having separate SSL lines coupled to global bit lines BL-N (e.g. BL-0, BL-1, BL-2, BL-3) at even and odd bit line contact structures on opposing ends of the block like that shown in FIG. 2, and to even and odd common source CS lines 520 and 521. The strings are connected to the corresponding global bit lines BL-0 to BL-3 by respective first string select switches (e.g. 530, 531, 532 and 533), also referred to as SSL switches. The strings are connected to the even or odd common source line for the plane by respective second string select switches (e.g. 540, 541), also referred to as ground select switches. A plurality of NAND strings in a block of memory cells has channel lines between the first string select switches and the second string select switches, and shares a set of word lines (e.g. WL0-WL28, . . . WL(i−2), WL(bnd2), WL(bnd1), WL(i+1), . . . WL33-WL61, WL(bnd3), WL(bnd4)) between the first and second string select switches. The set of word lines includes a first subset of the set of word lines (e.g. 551) in a selected block including word lines WL0-WL28, . . . WL(i−2), and a second subset of the set of word lines (e.g. 559) in the selected block including word lines WL(i+1), . . . WL33-WL61.

The memory includes a set of local word line drivers (e.g. 560-571), abbreviated as LWLD, that drive respective word lines in the set of word lines in the selected block of memory cells. The set of local word line drivers can include a first subset of the set of local word line drivers (e.g. 566-569) driving the first subset of the set of word lines (e.g. 551), a second subset of the set of local word line drivers (e.g. 559) driving the second subset of the set of word lines (e.g. 559), a first boundary word line driver (e.g. 565) driving the first boundary word line (e.g. WL(bnd1)) in the set of word lines between the first subset of the set of word lines and the second subset of the set of word lines, and a second boundary word line driver (e.g. 564) driving a boundary word line (e.g. WL(bnd2)) in the set of word lines between the first boundary word line and the second subset of the set of word lines.

The memory includes a set of global word lines, including first global word lines (e.g. 511g) connected to the first subset of the set of local word line drivers, second global word lines (e.g. 512g) connected to the second subset of the set of local word line drivers, a third global word line (e.g. 513g) connected to the first boundary word line driver, and a fourth driver fourth global word line (e.g. 514g) connected to the second boundary word line driver.

The memory includes a first global word line driver (e.g. 511) that drives the first global word lines 511g, in which there are N global word line signals provided in parallel for connection to selected blocks by the local word line decoder and local word line drives in this example. The memory includes a second global word line driver (e.g. 512) that drives the second global word lines 512g, in which there are M global word line signals provided in parallel for connection to selected blocks by the local word line decoder and local word line drives in this example.

Also, the memory includes a third global word line driver 513 producing a signal on the third global word line 513g that drives the local driver for the first boundary word line, and a fourth global word line driver 514 producing a signal on the fourth global word line 514g that drives the local driver for the second boundary word line. The third global word line driver 513 can include circuitry configured to provide the first boundary word line bias voltages to the first boundary word line during sub-block erase, in addition to the bias voltages used for other operations. The fourth global word line driver 514 can include circuitry configured to provide the second boundary word line bias voltages to the second boundary word line during sub-block erase, in addition to the bias voltages used for other operations.

The set of local word line drivers includes a third boundary word line driver (e.g. 570) driving a third boundary word line (e.g. WL(bnd3)) in the set of word lines adjacent the first subset of the set of word lines (e.g. 551) on a side of the first subset opposite the first boundary word line (e.g. WL(bnd1))), and a fourth boundary word line driver (e.g. 571) driving a fourth boundary word line (e.g. WL(bnd4)) in the set of word lines adjacent the third boundary word line on a side of the third boundary word line opposite the first subset of the set of word lines (e.g. 551). The third global word line (e.g. 513g) is connected to the third boundary word line driver; and the fourth global word line (e.g. 514g) is connected to the fourth boundary word line driver.

Only one set of even and odd blocks is illustrated in this example. But the global word lines can connect to the local word line driver circuits for many blocks.

A global word line decoder (e.g. 590), abbreviated as GWL decoder, is connected to the global word line drivers using conductors (e.g. 595) in a patterned conductor layer. The conductor can carry one or more output signals to the global word line drivers. A local word line decoder (e.g. 580), abbreviated as LWL decoder, is connected to the local word line drivers (e.g. 560-571) using conductors in patterned conductor layers, for connection of power signals, bias signals, address signals and/or other control signals to the local word line drivers. The connection from the local word line decoder 580 can include a control signal line 585 carrying control signals to each of the local word line drivers in the block.

A local word line driver (e.g. 566) can include an NMOS (N-type metal oxide semiconductor) transistor that has an input connected to a global word line (e.g. 511g) in the set of global word lines, an output connected to a word line (e.g. WL(i+1)) in the set of word lines, and a control gate connected to the control signal for local word line drivers (e.g. from control signal line 585) from the local word line decoder (e.g. 580). A global word line driver (e.g. 511) can include a level shifter that shifts output voltage levels according to one or more output signals from the global word line decoder (e.g. 590). For instance, the level shifter can vary the output voltage levels according to requirements by sub-block erase operations, and according to requirements by read, write and block erase operations.

Representative sub-block erase bias voltages using the configuration of local and global word line drivers can be understood based on the following table.

| Signals | Voltage |
| --- | --- |
| BL | +6 V |
| SSL/GSL | −2 V |
| control signal for local WL drivers | +15 V |
| first global word lines coupled to first set of WLs | −10 V |
| first/third boundary WL | −4 V |
| second/fourth boundary WL | +2 V |
| second global word lines coupled to second set of WLs | +4 V |
| CSL | +6 V |

In FIG. 5, a channel-side erase voltage (e.g. +6V) can be applied to the channel lines through the first string select switches (e.g. 530, 531, 532, 533) in the selected block, when the first string select switches are biased (e.g. at −2V) to connect the global bit lines BL-N (e.g. BL-0, BL-1, BL-2, BL-3) to different layers of channel lines in the NAND strings. Word line-side erase voltages can be applied to the first subset of the set of word liens in the selected block to induce tunneling in memory cells coupled to the first subset of the set of word lines. Word line-side inhibit voltages can be applied to the second subset of the set of word lines in the selected block to inhibit tunneling in memory cells coupled to the second subset of the set of word lines.

In one implementation, a first global word line voltage (−10V) can be applied on the first global word lines (e.g. 511g), which is connected to the first subset of the set of local word line drivers. A second global word line voltage (+4V) can be applied on the second global word lines (e.g. 512g), which is connected to the second subset of the set of local word line drivers. A control voltage (e.g. +15V) can be applied, for example via the control signal for local word line drivers (e.g. from control signal line 585), to turn on the first subset of the set of local word line drivers, providing the word line-side erase voltages to the first subset of the set of word lines, and to turn on the second subset of the set of local word line drivers, providing the word line-side inhibit voltages to the second subset of the set of word lines.

A third global word line voltage (e.g. −4V) can be applied on the third global word line (e.g. 513g), and a fourth global word line voltage (e.g. +2V) can be applied on the fourth global word line (e.g. 514g). When the control voltage (e.g. +15V) is applied on the control signal for local word line drivers (e.g. 585), the first boundary word line driver (e.g. 565) is turned on, to induce first boundary conditions, between the first subset of the set of word lines and the second boundary word line, and the second boundary word line driver (e.g. 564) is turned on, to induce second boundary conditions, between the first boundary word line and the second set of the set of word lines.

The first boundary conditions can include electric fields for suppression of hot carrier injection in memory cells coupled to the first subset of the set of word lines. The second boundary conditions can include electric fields for suppression of hot carrier injection in memory cells coupled to the second subset of the set of word lines. The hot carrier injection is inducible by difference between a first channel potential in the channel lines in memory cells coupled to the first subset and a second channel potential in the channel lines in memory cells coupled to the second subset.

In embodiments of the sub-block erase technology, more than one, or all, of the global word line drivers and local word line drivers can be designed to provide the boundary bias voltages. In these embodiments, the size of a sub-block in an erase operation can be defined logically, in response to a command from a source external or internal to the memory, or to a configuration word stored on the memory.

Figure 6:
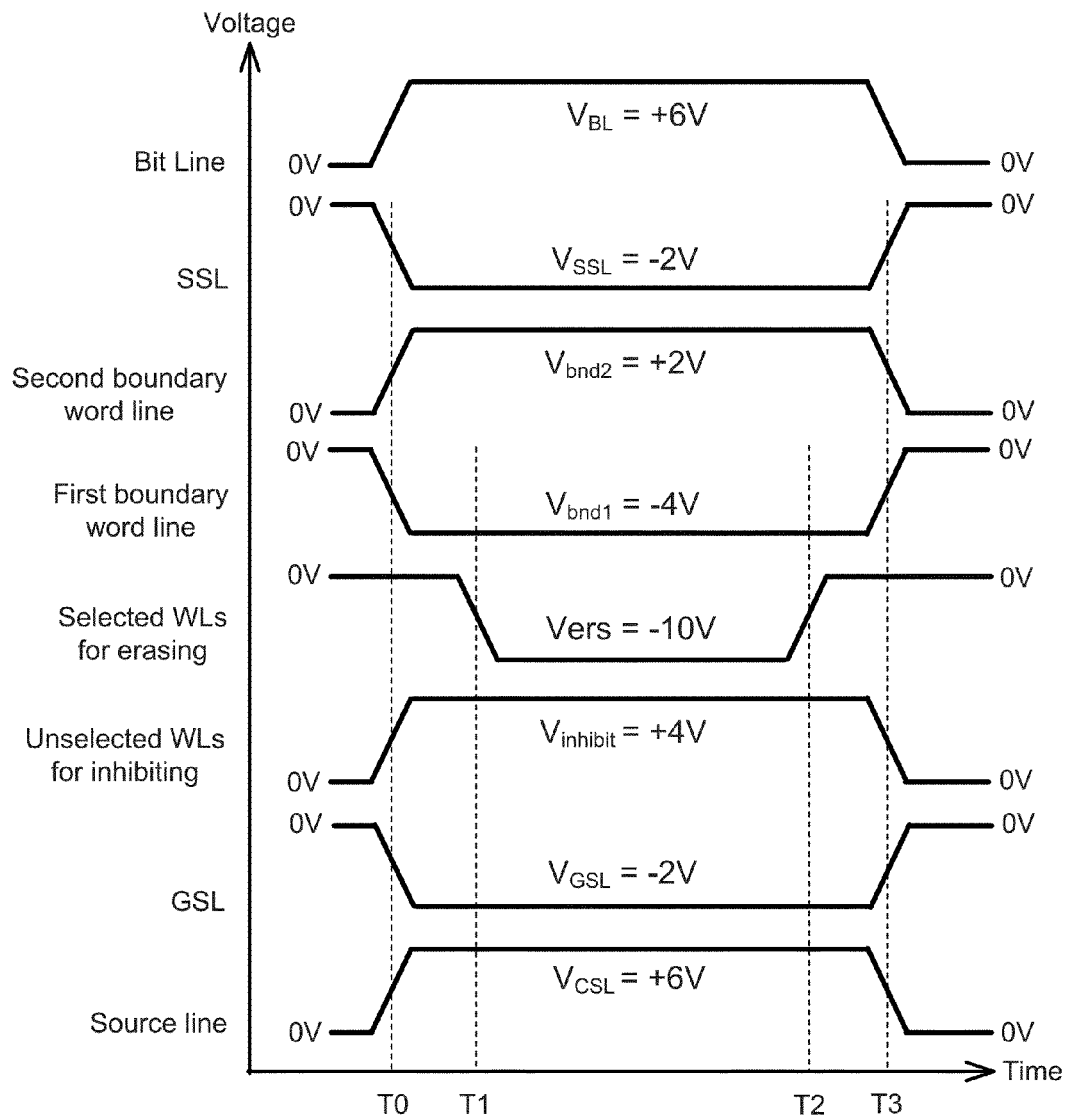
FIG. 6 is a timing diagram suitable for use with the sub-block erase operations as described in connection with the circuit shown in FIG. 5.

FIG. 6 is a timing diagram suitable for use with the sub-block erase operations as described in connection with the circuit shown in FIG. 5. As described for FIG. 5, a block of memory cells includes a plurality of NAND strings that have channel lines between first string select switches and second string select switches, and in which the plurality of NAND strings shares a set of word lines between the first and second string select switches.

At the beginning of a sub-block erase cycle, before time T0, voltages on the bit lines, the source line, the SSL, the GSL, the selected word lines for erasing, the unselected word lines for inhibiting, the first boundary word line and the second boundary word line can be at initial values such as 0V. At time T0, a channel-side erase voltage (e.g. $V_{BL}$=+6V) is applied to the channel lines through the first string select switches (e.g. SSL switches) in a selected block, and a source-side voltage (e.g. $V_{CSL}$=+6V) is applied to the channel lines through the second string select switches (e.g. GSL switches). At time T0, voltage on the SSL switches transitions to about $V_{SSL}$ (e.g. −2V), and voltage on the GSL switches transitions to about $V_{GSL}$ (e.g. −2V).

At time T0, a first bias voltage Vbnd1 (e.g. −4V) is applied on the first boundary word line in the set of word lines in the selected block, to induce boundary conditions, between the selected subset on one side of the boundary word line and the unselected subset on another side of the boundary word line, and a second bias voltage Vbnd2 (e.g. +2V) is applied on the first boundary word line in the set of word lines in the selected block, to induce boundary conditions, between the selected subset on one side of the boundary word line and the unselected subset on another side of the boundary word line.

At time T0, word line-side inhibit voltages (e.g. +4V) are applied to an unselected subset of the set of word lines in the selected block to inhibit tunneling in memory cells coupled to the unselected subset.

At time T1 subsequent to time T0, word line-side erase voltages (e.g. Vers=−10V) are applied to the selected subset of the set of word lines, to induce tunneling, such as hole tunneling, in memory cells coupled to the selected subset. At time T2, the voltages on the selected subset of the set of word lines can return to about 0V. At time T3, the sub-block erase cycle ends, and other voltages can also return to about 0V.

In the sub-block erase operations described herein, the first bias voltage (e.g. −4V) can be between the word line-side erase voltages (e.g. −10V) and the second bias voltage (e.g. +2V), and the word line-side inhibit voltages (e.g. +4V) is higher than the second bias voltage.

Figure 7:
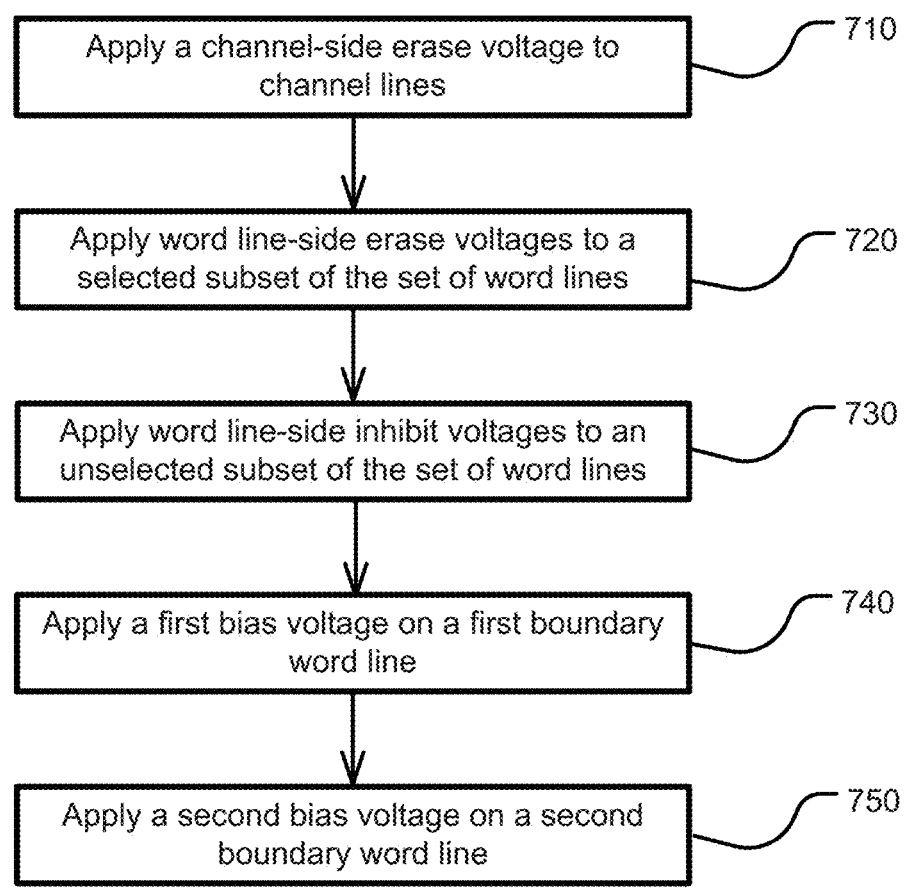
FIG. 7 is a flowchart of a procedure which can be used for sub-block erase operations as described herein.

FIG. 7 is a flowchart of a procedure which can be used for sub-block erase operations as described herein. A controller, such as implemented as a state machine 119 in an integrated circuit 100 (FIG. 1), can carry out the various operations in the procedure.

The controller can receive a sub-block erase command from a source external to or internal to the integrated circuit to erase memory cells coupled to a selected subset of a set of word lines in a selected block in a NAND array (e.g. 110, FIG. 1). A number of word lines for the selected subset of the set of word lines can be logically selected. The sub-block erase command can include a parameter indicating the size of a sub-block to be erased, where the size can be the number of word lines (e.g. 11), or a range of word lines (e.g. WL10-WL20), for the selected subset of the set of word lines. In response to the sub-block erase command, steps illustrated in FIG. 7 can be executed.

At Step 710, a channel-side erase voltage (e.g. +6V) can be applied to the channel lines through the first string select switches (e.g. 530, 531, 532 and 533, FIG. 5) in a selected block of memory cells. A source line voltage (e.g. +6V) can also be applied to the channel lines through the second string select switches (e.g. 540, 541, FIG. 5) in the selected block. The source line voltage can match the channel-side erase voltage. At Step 720, word line-side erase voltages (e.g. −10V) can be applied to a selected subset of the set of word lines in the selected block to induce tunneling, such as hole tunneling, in memory cells coupled to the selected subset. At Step 730, word line-side inhibit voltages (e.g. +4V) can be applied to an unselected subset of the set of word lines in the selected block to inhibit tunneling, such as hole tunneling, in memory cells coupled to the unselected subset.

At Step 740, a first bias voltage can be applied on a first boundary word line (e.g. WL(bnd1), FIG. 5) in the set of word lines, to induce first boundary conditions, between the selected subset of the set of word lines and the unselected subset of the set of word lines. The first bias voltage can also be applied on a third boundary word line (e.g. WL(bnd3), FIG. 5) in the set of word lines, to induce the first boundary conditions, where the third boundary word line is adjacent the selected subset on a side of the selected subset opposite the first boundary word line.

At Step 750, a second bias voltage can be applied on a second boundary word line (e.g. WL(bnd2), FIG. 5) in the set of word lines, to induce second boundary conditions, between the first boundary word line and the unselected subset of the set of word lines. The second bias voltage can also be applied on a fourth boundary word line (e.g. WL(bnd4), FIG. 5) in the set of word lines, to induce the second boundary conditions, where the fourth boundary word line is adjacent the third boundary word line on a side of the third boundary word line opposite the selected subset of the set of word lines.

An order in which the Steps are executed can be different from the order in which the Steps are shown in FIG. 7. For instance, Step 720 can be executed after voltages described in Steps 710 and 730-750 are applied.

In one implementation, data stored in memory cells coupled to the first boundary word line and the second boundary word line in the selected block can be moved to another block in the plurality of blocks of memory cells, before the word line-side erase voltages are applied to the selected subset of the set of word lines in the selected block. Subsequently, the data moved to the other block can be moved back to the memory cells coupled to the first boundary word line and the second boundary word line in the selected block respectively, after the word line-side erase voltages are applied.

For instance, in a selected block of memory cells in which a plurality of NAND strings shares a set of 64 word lines from WL0 to WL63, the parameter in the sub-block erase command indicates that memory cells coupled to a selected subset of the set of word lines in a range from WL10 to WL20 are to be erased. Consequently, word lines WL9, WL8, WL21 and WL22 can act as the first boundary word line, the second boundary word line, the third boundary word line, and the fourth boundary word line, respectively.

Before the word line-side erase voltages are applied to the selected subset of the set of word lines in the selected block, data stored in memory cells coupled to word lines WL9, WL8, WL21 and WL22 are moved to another block of memory cells. The word line-side erase voltages are then applied to the selected subset of the set of word lines to erase memory cells coupled to word lines WL10 to WL20.

A verify operation can be performed on memory cells coupled to word lines in the selected subset of the set of word lines and adjacent the first boundary word line and the third boundary word line (e.g. WL10, and WL20), since those memory cells are more likely to experience disturb due to hot carrier injection inducible by difference between a first channel potential in the channel lines in memory cells coupled to the selected subset and a second channel potential in the channel lines in memory cells coupled to the unselected subset.

After the word line-side erase voltages are applied to the selected subset of the set of word lines, data moved to the other block are moved back to the memory cells coupled to word lines WL9, WL8, WL21 and WL22. Consequently, only data in memory cells coupled to four boundary word lines need to be moved to another block and then moved back, in the sub-block erase operation as described herein.

In comparison, in a conventional block erase operation, in order to erase memory cells coupled to word lines in a range (e.g. WL10 to WL20) in a block of memory cells having 64 word lines, data in memory cells coupled to other word lines in the block (e.g. WL0 to WL9 and WL21-63 totaling 53 word lines) need to be moved to another block before the block erase operation and then moved back after the block erase operation. Accordingly the sub-block erase operation as described herein can improve the timing specification for erase operations and the performance of an integrated circuit including a 3D NAND array.

Figure 8:
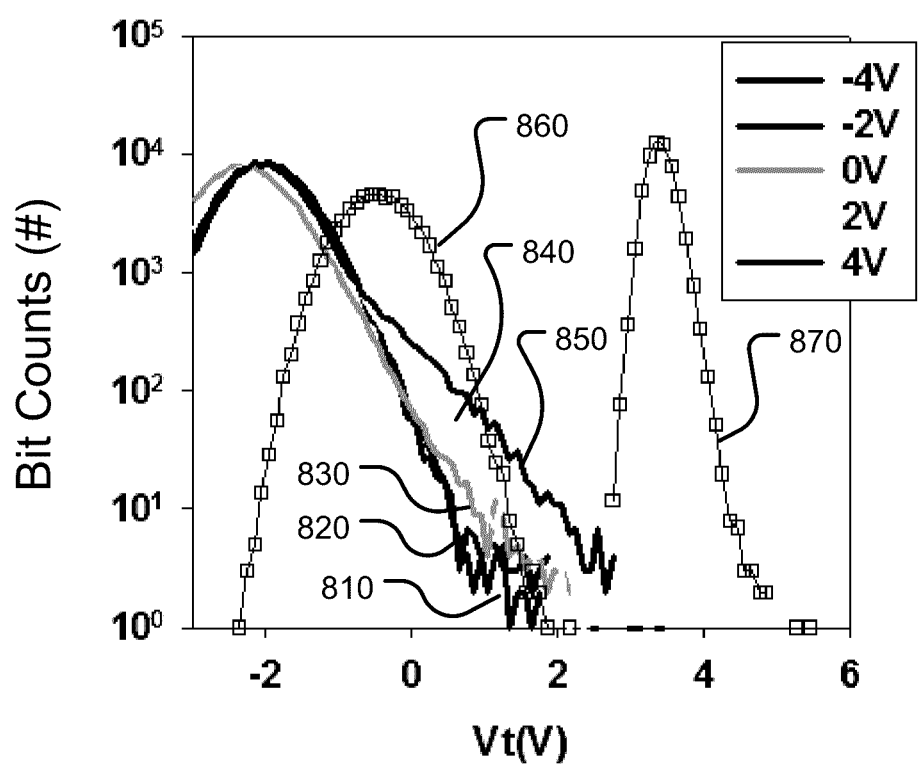
FIG. 8 is a graph of threshold voltage distributions for a selected block of memory cells after sub-block erase operations.

FIG. 8 is a graph of threshold voltage distributions for a selected block of memory cells after sub-block erase operations. Threshold voltage distributions 810, 820, 830, 840 and 850 are shown for memory cells coupled to a selected subset of the set of word lines in the selected block at respective voltage values (e.g. −4V, −2V, 0V, 2V and 4V), for the first bias voltage applied on the first boundary word line (e.g. WL (bnd1), FIG. 5). Other voltages applied in the sub-block erase operations are as described in connection with FIG. 6. For comparison, a threshold voltage distribution (e.g. 860) is shown for memory cells coupled to the set of word lines after a block erase operation. A threshold voltage distribution (e.g. 810) is also shown for memory cells at programmed states coupled to the unselected subset of the set of word lines in the selected block.

The first, second, third and fourth boundary word lines may be disturbed during a sub-block erase operation. In one implementation, one or more of the first, second, third and fourth boundary word lines can be used as dummy word lines so that no data is stored in memory cells coupled to the boundary word lines. In an alternative implementation, data stored in memory cells coupled to the boundary word lines in a selected block may be disturbed but not lost during a sub-block erase operation, such that an ECC (error correcting code) operation can detect and correct errors in memory cells coupled to the boundary word lines.

FIG. 8 illustrates that an erase operation can be executed that causes memory cells coupled to the selected subset to have a first threshold voltage distribution (e.g. 810) that is non-overlapping with a second threshold voltage distribution (e.g. 870) of memory cells at programmed states coupled to the unselected subset, where the erase operation includes one or more erase and verify cycles including applying the first bias voltage at a voltage value (e.g. −4V) between the word line-side erase voltages (e.g. −10V) and the second bias voltage (e.g. +2V), while applying other voltages in the sub-block erase operations as described in connection with FIG. 6. In comparison, a different erase operation may cause memory cells coupled to the selected subset to have a threshold voltage distribution (e.g. 850) that is overlapping with the second threshold voltage distribution (e.g. 870) of memory cells at programmed states coupled to the unselected subset, where the different erase operation includes one or more erase and verify cycles including applying the first bias voltage at a voltage value (e.g. 4V) higher than the second bias voltage (e.g. +2V).

Figure 9:
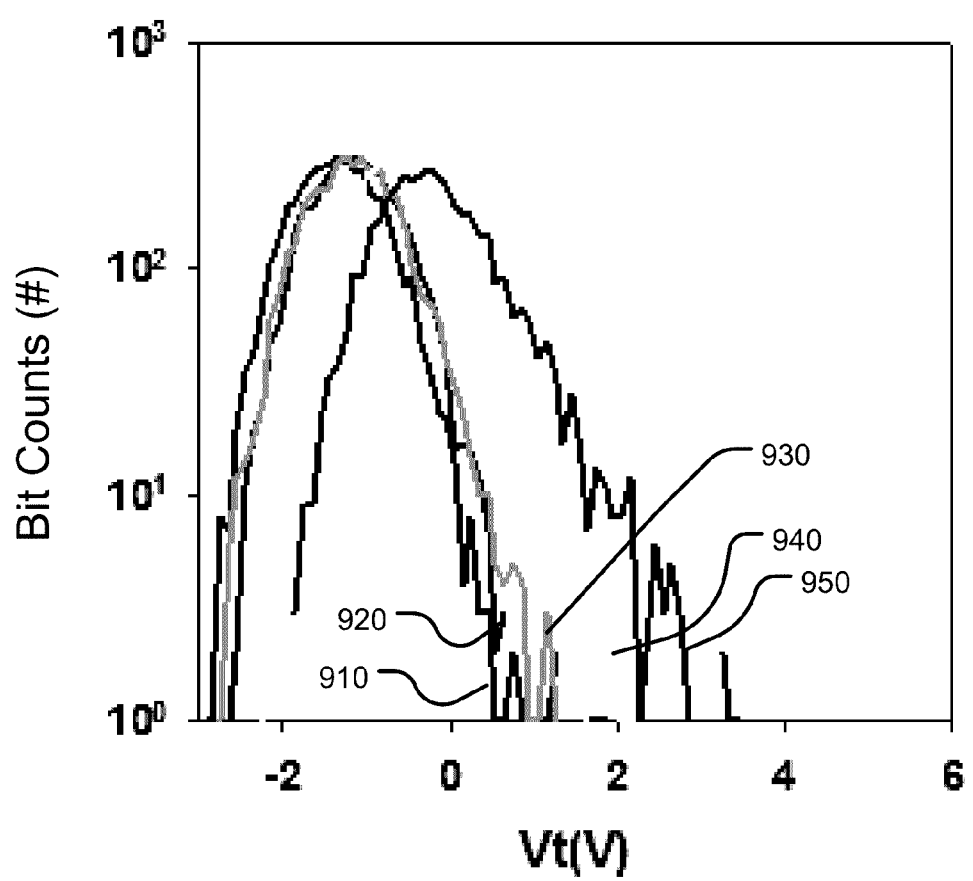
FIG. 9 is a graph of threshold voltage distributions for memory cells coupled to word lines in the selected subset of the set of word lines and adjacent the first boundary word line and the third boundary word line for a selected block of memory cells after sub-block erase operations.

FIG. 9 is a graph of threshold voltage distributions for memory cells coupled to word lines in the selected subset of the set of word lines (e.g. 551) and adjacent the first boundary word line WL(bnd1) and the third boundary word line WL(bnd3) (e.g. WL(i+1) and WL61, FIG. 5) for a selected block of memory cells after sub-block erase operations. Those memory cells are more likely to experience disturb due to hot carrier injection inducible by difference between a first channel potential in the channel lines in memory cells coupled to the selected subset and a second channel potential in the channel lines in memory cells coupled to the unselected subset.

Threshold voltage distributions 910, 920, 930, 940 and 950 are shown for memory cells coupled to word lines in the selected subset of the set of word lines and adjacent the first boundary word line and the third boundary word line, at respective voltage values (e.g. −4V, −2V, 0V, 2V and 4V) for the first bias voltage applied on the first boundary word line (e.g. WL (bnd1), FIG. 5) and on the third boundary word line (e.g. WL (bnd3), FIG. 5). Other voltages applied in the sub-block erase operations are as described in connection with FIG. 6.

FIG. 9 illustrates that an erase operation can be executed that causes cause memory cells coupled to the selected subset and adjacent the first boundary word line and the third boundary word line to have a first threshold voltage distribution (e.g. 910) that is non-overlapping with a second threshold voltage distribution (e.g. 870, FIG. 8) of memory cells at programmed states coupled to the unselected subset, where the erase operation includes one or more erase and verify cycles including applying the first bias voltage at a voltage value (e.g. −4V) between the word line-side erase voltages (e.g. −10V) and the second bias voltage (e.g. +2V), while applying other voltages in the sub-block erase operations as described in connection with FIG. 6. In comparison, a different erase operation may cause memory cells coupled to the selected subset and adjacent the first boundary word line and the third boundary word line to have a threshold voltage distribution (e.g. 950) that is overlapping with the second threshold voltage distribution (e.g. 870, FIG. 8) of memory cells at programmed states coupled to the unselected subset, where the different erase operation includes one or more erase and verify cycles including applying the first bias voltage at a voltage value (e.g. 4V) higher than the second bias voltage (e.g. +2V).

Embodiments of the sub-block erase operations have been described with reference to the vertical gate architecture shown in FIG. 3. The operations can be tuned for a variety of 3-D memory architectures. Also, embodiments of the sub-block erase operations have been described with reference to flash memory. The operations can be tuned for other memory cell types as well.

While the present technology is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the technology and the scope of the following claims.

The invention claimed is:

1. A method of operating a NAND array that includes a plurality of blocks of memory cells, wherein a block of memory cells in the plurality of blocks comprises a plurality of NAND strings having channel lines between first string select switches and second string select switches, and in which the plurality of NAND strings shares a set of word lines between the first and second string select switches, comprising:
   applying a channel-side erase voltage to the channel lines through the first string select switches in a selected block;
   applying word line-side erase voltages to a selected subset of the set of word lines in the selected block to induce tunneling in memory cells coupled to the selected subset, the selected subset including more than one member of the set of word lines;
   applying word line-side inhibit voltages to an unselected subset of the set of word lines in the selected block to inhibit tunneling in memory cells coupled to the unselected subset, the unselected subset including more than one member of the set of word lines;
   applying a first bias voltage on a first boundary word line in the set of word lines, to induce first boundary conditions, between the selected subset of the set of word lines and the unselected subset of the set of word lines; and
   applying a second bias voltage on a second boundary word line in the set of word lines, to induce second boundary conditions, between the first boundary word line and the unselected subset of the set of word lines,
   wherein the first bias voltage is between the word line-side erase voltages and the second bias voltage, and the word line-side inhibit voltages are higher than the second bias voltage.

2. The method of claim 1, wherein the first boundary conditions include electric fields for suppression of hot carrier injection in memory cells coupled to the selected subset, wherein the hot carrier injection is inducible by difference between a first channel potential in the channel lines in memory cells coupled to the selected subset and a second channel potential in the channel lines in memory cells coupled to the unselected subset.

3. The method of claim 1, wherein the second boundary conditions include electric fields for suppression of hot carrier injection in memory cells coupled to the unselected subset, wherein the hot carrier injection is inducible by difference between a first channel potential in the channel lines in memory cells coupled to the selected subset and a second channel potential in the channel lines in memory cells coupled to the unselected subset.

4. The method of claim 1, comprising:
   executing an erase operation causing memory cells coupled to the selected subset to have a first threshold voltage distribution that is non-overlapping with a second threshold voltage distribution of memory cells at programmed states coupled to the unselected subset, wherein the erase operation includes one or more erase and verify cycles including said applying the first bias voltage and said applying the second bias voltage, during said applying the word line-side erase voltages and said applying the word line-side inhibit voltages.

5. The method of claim 1, comprising:
   moving data stored in memory cells coupled to the first boundary word line and the second boundary word line in the selected block to another block in the plurality of blocks of memory cells, before said applying the word line-side erase voltages; and
   moving the data stored in the other block back to the memory cells coupled to the first boundary word line and the second boundary word line in the selected block respectively, after said applying the word line-side erase voltages.

6. The method of claim 1, comprising:
   applying the first bias voltage on a third boundary word line in the set of word lines, to induce the first boundary conditions, wherein the third boundary word line is adjacent the selected subset on a side of the selected subset opposite the first boundary word line; and
   applying the second bias voltage on a fourth boundary word line in the set of word lines, to induce the second boundary conditions, wherein the fourth boundary word line is adjacent the third boundary word line on a side of the third boundary word line opposite the selected subset of the set of word lines.

7. The method of claim 1, wherein the set of word lines includes a first boundary word line between the selected subset of the set of word lines and the unselected subset of the set of word lines, and a second boundary word line between the first boundary word line and the unselected subset of the set of word lines, comprising:
   moving data stored in memory cells coupled to the first boundary word line and the second boundary word line in the selected block to another block in the plurality of blocks of memory cells, before said applying the word line-side erase voltages; and
   moving the data stored in the other block back to the memory cells coupled to the first boundary word line and the second boundary word line in the selected block respectively, after said applying the word line-side erase voltages.

8. The method of claim 1, wherein the set of word lines includes a first boundary word line between the selected subset of the set of word lines and the unselected subset of the set of word lines, and a second boundary word line between the first boundary word line and the unselected subset of the set of word lines, comprising:
   logically selecting a number of word lines for the selected subset of the set of word lines;
   moving data stored in memory cells coupled to the first boundary word line and the second boundary word line in the selected block to another block in the plurality of blocks of memory cells, before said applying the word line-side erase voltages; and
   moving the data stored in the other block back to the memory cells coupled to the first boundary word line and the second boundary word line in the selected block respectively, after said applying the word line-side erase voltages.

9. The method of claim 1, comprising:
   executing said applying the channel-side erase voltage, said applying the word line-side erase voltages, and said applying the word line-side inhibit voltages, in response to a command to erase memory cells coupled to the selected subset of the set of word lines in the selected block.

10. A memory, comprising:
    a NAND array that includes a plurality of blocks of memory cells, wherein a block of memory cells in the plurality of blocks comprises a plurality of NAND strings having channel lines between first string select switches and second string select switches, and in which the plurality of NAND strings shares a set of word lines between the first and second string select switches;

a set of local word line drivers driving respective word lines in the set of word lines in a selected block, including a first subset of the set of local word line drivers driving a first subset of the set of word lines, a second subset of the set of local word line drivers driving a second subset of the set of word lines, a first boundary word line driver driving a first boundary word line in the set of word lines between the first subset of the set of word lines and the second subset of the set of word lines, and a second boundary word line driver driving a second boundary word line in the set of word lines between the first boundary word line and the second subset of the set of word lines;

a set of global word lines, including first global word lines connected to the first subset of the set of local word line drivers, second global word lines connected to the second subset of the set of local word line drivers, a third global word line connected to the first boundary word line driver, and a fourth global word line connected to the second boundary word line driver; and a controller coupled to the blocks of memory cells, including:

logic to apply a channel-side erase voltage to the channel lines through the first string select switches in the selected block;

logic to apply word line-side erase voltages to the first subset of the set of word lines in the selected block to induce tunneling in memory cells coupled to the first subset, the first subset including more than one member of the set of word lines; and logic to apply word line-side inhibit voltages to the second subset of the set of word lines in the selected block to inhibit tunneling in memory cells coupled to the second subset, the second subset including more than one member of the set of word lines.

11. The memory of claim 10, the controller including:
logic to apply a first global word line voltage on the first global word lines;
logic to apply a second global word line voltage on the second global word lines;
logic to turn on the first subset of the set of local word line drivers, providing the word line-side erase voltages to the first subset of the set of word lines; and
logic to turn on the second subset of the set of local word line drivers, providing the word line-side inhibit voltages to the second subset of the set of word lines.

12. The memory of claim 11, the controller further including:
logic to apply a third global word line voltage on the third global word line;
logic to apply a fourth global word line voltage on the fourth global word line;
logic to turn on the first boundary word line driver, to induce first boundary conditions, between the first subset of the set of word lines and the second boundary word line; and
logic to turn on the second boundary word line driver, to induce second boundary conditions, between the first boundary word line and the second subset of the set of word lines, wherein the third global word line voltage is between the first global word line voltage and the fourth global word line voltage, and the second global word line voltage is higher than the fourth global word line voltage.

13. The memory of claim 12, wherein the first boundary conditions include electric fields for suppression of hot carrier injection in memory cells coupled to the first subset of the set of word lines, wherein the hot carrier injection is inducible by difference between a first channel potential in the channel lines in memory cells coupled to the first subset of the set of word lines and a second channel potential in the channel lines in memory cells coupled to the second subset of the set of word lines.

14. The memory of claim 12, wherein the second boundary conditions include electric fields for suppression of hot carrier injection in memory cells coupled to the second subset of the set of word lines, wherein the hot carrier injection is inducible by difference between a first channel potential in the channel lines in memory cells coupled to the first subset of the set of word lines and a second channel potential in the channel lines in memory cells coupled to the second subset of the set of word lines.

15. The memory of claim 10, the controller including:
logic to move data stored in memory cells coupled to the first boundary word line and the second boundary word line in the selected block to another block in the plurality of blocks of memory cells, before executing said logic to apply the word line-side erase voltages; and
logic to move the data stored in the other block back to the memory cells coupled to the first boundary word line and the second boundary word line respectively, after executing said logic to apply the word line-side erase voltages.

16. The memory of claim 10, wherein:
the set of local word line drivers includes a third boundary word line driver driving a third boundary word line in the set of word lines adjacent the first subset of the set of word lines on a side of the first subset opposite the first boundary word line, and a fourth boundary word line driver driving a fourth boundary word line in the set of word lines adjacent the third boundary word line on a side of the third boundary word line opposite the first subset of the set of word lines;
the third global word line is connected to the third boundary word line driver; and
the fourth global word line is connected to the fourth boundary word line driver.

17. The memory of claim 10, wherein the set of word lines includes a first boundary word line between the first subset of the set of word lines and the second subset of the set of word lines, and a second boundary word line between the first boundary word line and the second subset of the set of word lines, the controller including:
logic to move data stored in memory cells coupled to the first boundary word line and the second boundary word line in the selected block to another block in the plurality of blocks of memory cells, before executing said logic to apply the word line-side erase voltages; and
logic to move the data stored in the other block back to the memory cells coupled to the first boundary word line and the second boundary word line in the selected block respectively, after executing said logic to apply the word line-side erase voltages.

18. The memory of claim 10, wherein the set of word lines includes a first boundary word line between the first subset of the set of word lines and the second subset of the set of word lines, and a second boundary word line between the first boundary word line and the second subset of the set of word lines, the controller including:
- logic to select a number of word lines for the selected subset of the set of word lines;
- logic to move data stored in memory cells coupled to the first boundary word line and the second boundary word line in the selected block to another block in the plurality of blocks of memory cells, before executing said logic to apply the word line-side erase voltages; and
- logic to move the data stored in the other block back to the memory cells coupled to the first boundary word line and the second boundary word line in the selected block respectively, after executing said logic to apply the word line-side erase voltages.

19. The memory of claim 10, wherein the controller is configured to execute said logic to apply the channel-side erase voltage, said logic to apply the word line-side erase voltages, and said logic to apply the word line-side inhibit voltages, in response to a command to erase memory cells coupled to the first subset of the set of word lines in the selected block.

* * * * *